US012609162B2

(12) United States Patent
Han et al.

(10) Patent No.: US 12,609,162 B2
(45) Date of Patent: Apr. 21, 2026

(54) PAGE BUFFER RELATED TO PERFORMING A PROGRAM OPERATION, MEMORY DEVICE INCLUDING A PAGE BUFFER, AND METHOD OF OPERATING THE PAGE BUFFER

(71) Applicant: SK hynix Inc., Icheon-si (KR)

(72) Inventors: Chang Hyun Han, Icheon-si (KR); Moon Soo Sung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 88 days.

(21) Appl. No.: 18/676,044

(22) Filed: May 28, 2024

(65) Prior Publication Data

US 2025/0191658 A1 Jun. 12, 2025

(30) Foreign Application Priority Data

Dec. 8, 2023 (KR) ........................ 10-2023-0177437

(51) Int. Cl.
| | |
|---|---|
| *G11C 16/04* | (2006.01) |
| *G11C 16/10* | (2006.01) |
| *G11C 16/24* | (2006.01) |
| *G11C 16/26* | (2006.01) |
| *G11C 16/34* | (2006.01) |

(52) U.S. Cl.
CPC .............. *G11C 16/10* (2013.01); *G11C 16/24* (2013.01); *G11C 16/26* (2013.01); *G11C 16/3459* (2013.01); *G11C 16/0483* (2013.01)

(58) Field of Classification Search
CPC ......... G11C 16/10; G11C 16/24; G11C 16/26; G11C 16/3459; G11C 16/0483

USPC ...................................................... 365/185.22
See application file for complete search history.

(56) References Cited

U.S. PATENT DOCUMENTS

| | | | | |
|---|---|---|---|---|
| 2010/0195385 A1* | 8/2010 | Lim | ..................... | G11C 11/5628 |
| | | | | 365/185.25 |
| 2010/0329020 A1* | 12/2010 | Han | ..................... | G11C 11/5628 |
| | | | | 365/185.25 |
| 2010/0329032 A1* | 12/2010 | Lim | ..................... | G11C 11/5628 |
| | | | | 365/185.24 |
| 2020/0387329 A1* | 12/2020 | Choi | ....................... | G11C 16/26 |
| 2022/0059174 A1* | 2/2022 | Choi | ....................... | G11C 16/08 |

(Continued)

FOREIGN PATENT DOCUMENTS

| | | |
|---|---|---|
| KR | 100923821 B1 | 10/2009 |
| KR | 1020180055444 A | 5/2018 |

*Primary Examiner* — Ly D Pham
(74) *Attorney, Agent, or Firm* — WILLIAM PARK AND ASSOCIATES LTD.

(57) ABSTRACT

Provided herein may be a page buffer. The page buffer includes a sensing node connected to a bit line, a bit line voltage controlling circuit configured to precharge the bit line during a verify operation, a sensing node voltage controller configured to precharge the sensing node while the bit line is precharged, a first latch connected to the sensing node, and configured to store a first bit value determined based on a first evaluation operation among bit values corresponding to a voltage level of the sensing node after the sensing node is precharged, and a second latch connected to the sensing node, and configured to store a second bit value determined based on a second evaluation operation after the first bit value is stored. The first latch stores the first bit value determined based on a third evaluation operation after the second bit value is stored in the second latch.

16 Claims, 14 Drawing Sheets

(56) References Cited

U.S. PATENT DOCUMENTS

| | | | | |
|---|---|---|---|---|
| 2022/0108757 A1* | 4/2022 | Choi | .................... | G11C 7/1087 |
| 2022/0230690 A1* | 7/2022 | Chai | ........................ | G11C 7/12 |
| 2023/0039585 A1* | 2/2023 | Mun | ....................... | G11C 16/26 |
| 2023/0290420 A1* | 9/2023 | Choi | .................. | G11C 16/0483 |
| 2024/0379177 A1* | 11/2024 | Kim | ....................... | G11C 16/32 |
| 2024/0404609 A1* | 12/2024 | Kim | ....................... | G11C 16/10 |

* cited by examiner

Latch Status1

|     | AREA1 | AREA2 | AREA3 | AREA4 |
|-----|-------|-------|-------|-------|
| LC1 | 1     | 0     | 0     | 0     |
| LC2 | 1     | 1     | 1     | 1     |

Latch Status2

|     | AREA1 | AREA2 | AREA3 | AREA4 |
|-----|-------|-------|-------|-------|
| LC1 | 1     | 0     | 0     | 0     |
| LC2 | 1     | 1     | 0     | 0     |

Latch Status3

|     | AREA1 | AREA2 | AREA3 | AREA4 |
|-----|-------|-------|-------|-------|
| LC1 | 1     | 0     | 0     | 1     |
| LC2 | 1     | 1     | 0     | 0     |

Latch Status3

|  | AREA1 | AREA2 | AREA3 | AREA4 |
|---|---|---|---|---|
| LC1 | 1 | 0 | 0 | 1 |
| LC2 | 1 | 1 | 0 | 0 |

Latch Status4

|  | AREA1 | AREA2 | AREA3 | AREA4 |
|---|---|---|---|---|
| LC1 | 1 | 0 | 1 | 1 |
| LC2 | 1 | 1 | 0 | 0 |

Latch Status4

|      | AREA1 | AREA2 | AREA3 | AREA4 |
|------|-------|-------|-------|-------|
| LC1  | 1     | 0     | 1     | 1     |
| LC2  | 1     | 1     | 0     | 0     |

Latch Status5

|      | AREA1 | AREA2 | AREA3 | AREA4 |
|------|-------|-------|-------|-------|
| LC1  | 1     | 0     | 0     | 0     |
| LC2  | 1     | 1     | 0     | 0     |

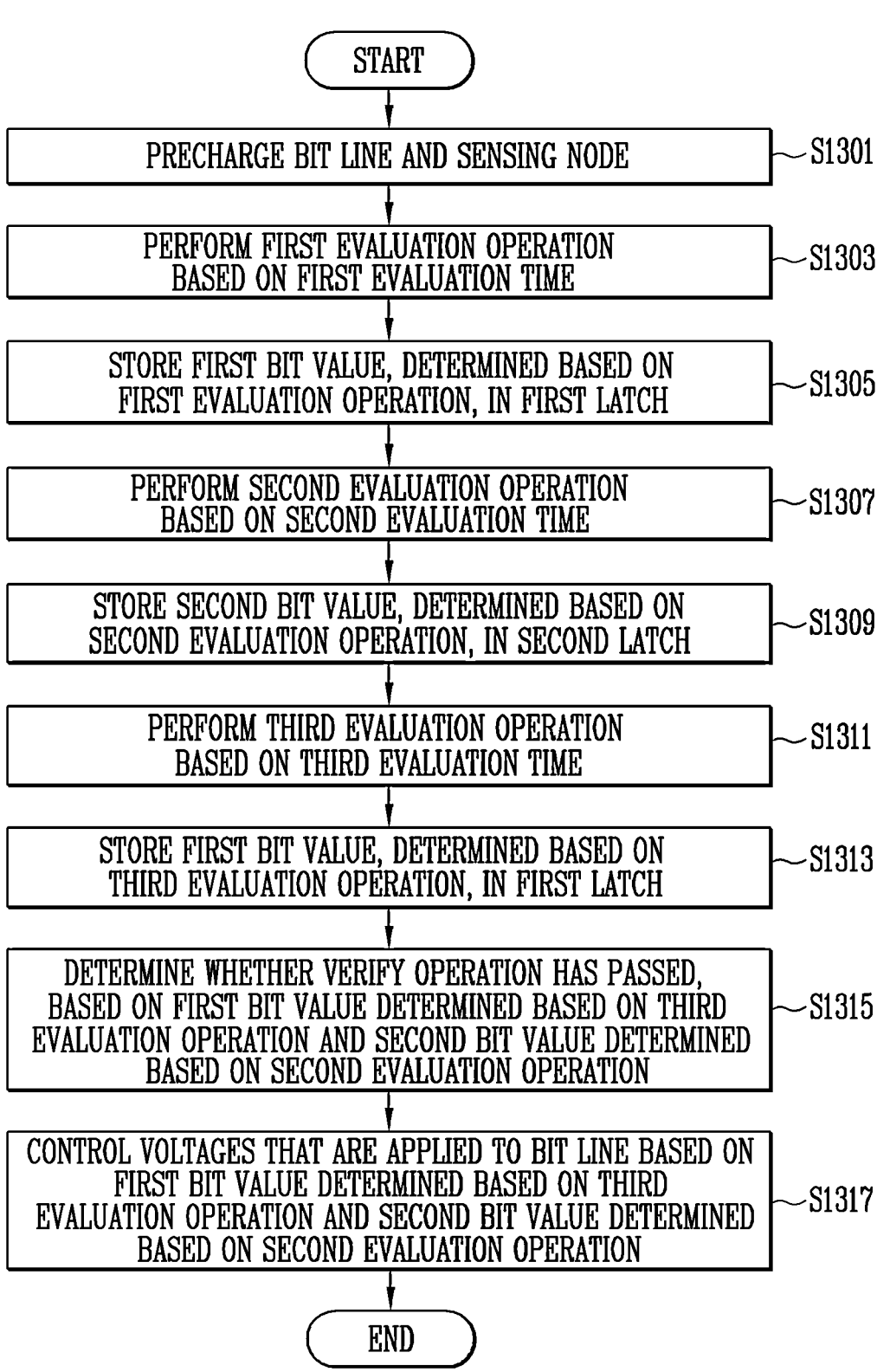

START

PRECHARGE BIT LINE AND SENSING NODE　～S1301

PERFORM FIRST EVALUATION OPERATION
BASED ON FIRST EVALUATION TIME　～S1303

STORE FIRST BIT VALUE, DETERMINED BASED ON
FIRST EVALUATION OPERATION, IN FIRST LATCH　～S1305

PERFORM SECOND EVALUATION OPERATION
BASED ON SECOND EVALUATION TIME　～S1307

STORE SECOND BIT VALUE, DETERMINED BASED ON
SECOND EVALUATION OPERATION, IN SECOND LATCH　～S1309

PERFORM THIRD EVALUATION OPERATION
BASED ON THIRD EVALUATION TIME　～S1311

STORE FIRST BIT VALUE, DETERMINED BASED ON
THIRD EVALUATION OPERATION, IN FIRST LATCH　～S1313

DETERMINE WHETHER VERIFY OPERATION HAS PASSED,
BASED ON FIRST BIT VALUE DETERMINED BASED ON THIRD
EVALUATION OPERATION AND SECOND BIT VALUE DETERMINED
BASED ON SECOND EVALUATION OPERATION　～S1315

CONTROL VOLTAGES THAT ARE APPLIED TO BIT LINE BASED ON
FIRST BIT VALUE DETERMINED BASED ON THIRD
EVALUATION OPERATION AND SECOND BIT VALUE DETERMINED
BASED ON SECOND EVALUATION OPERATION　～S1317

END

PAGE BUFFER RELATED TO PERFORMING A PROGRAM OPERATION, MEMORY DEVICE INCLUDING A PAGE BUFFER, AND METHOD OF OPERATING THE PAGE BUFFER

CROSS-REFERENCE TO RELATED APPLICATION

The present application claims priority under 35 U.S.C. § 119(a) to Korean patent application number 10-2023-0177437 filed on Dec. 8, 2023, in the Korean Intellectual Property Office, the entire contents of which application is incorporated herein by reference.

BACKGROUND

1. Technical Field

Various embodiments of the present disclosure generally relate to a semiconductor device, and more particularly to a page buffer related to performing a program operation, a memory device including the page buffer, and a method of operating the page buffer.

2. Related Art

Memory devices may be devices in which data is stored, and may be classified into a volatile memory device and a nonvolatile memory device.

Each memory device may include a page buffer. The page buffer may sense and store data stored in a memory cell through a bit line coupled to the memory cell during a read operation or a verify operation.

During the verify operation, when a program state is verified using one verify voltage, the range of a threshold voltage distribution may be widened depending on different program speeds of memory cells. Therefore, the memory device may perform a program operation according to a triple verify program (TPGM) method to form a narrower threshold voltage distribution range and improve the speed of the program operation. The triple verify program method may be an operation of performing a verify operation using three verify voltages that are sequentially increasing or an operation of sensing memory cells three times by differently setting a time based on one verify voltage.

Meanwhile, in the case of the triple verify program method, three latches may be required in the page buffer in order to store verify data. However, when the number of latches increases, the size of the page buffer increases, and thus a scheme for performing the triple verify program method while reducing the number of latches is required.

SUMMARY

An embodiment of the present disclosure may provide for a page buffer connected to a memory cell through a bit line. The page buffer may include a sensing node connected to the bit line, a bit line voltage controlling circuit configured to precharge the bit line during a verify operation, a sensing node voltage controller configured to precharge the sensing node while the bit line is precharged, a first latch connected to the sensing node, and configured to store a first bit value that is determined based on a first evaluation operation among a plurality of bit values corresponding to a voltage level of the sensing node after the sensing node is precharged, and a second latch connected to the sensing node, and configured to store a second bit value determined based on a second evaluation operation among the plurality of bit values after the first bit value is stored in the first latch, wherein the first latch stores the first bit value that is determined based on a third evaluation operation after the second bit value is stored in the second latch.

An embodiment of the present disclosure may provide for a memory device. The memory device may include a memory cell included in any one of a plurality of threshold voltage areas divided by a plurality of reference voltages depending on a program operation, a page buffer connected to the memory cell through a bit line, and a program operation controller configured to control the program operation, wherein the page buffer may include a first latch configured to store a first bit value among a plurality of bit values indicating the one threshold voltage area during a verify operation included in the program operation, a second latch configured to store a second bit value among the plurality of bit values during the verify operation, and a bit line voltage controlling circuit configured to, during a program voltage apply operation included in the program operation after the verify operation, control a voltage that is applied to the bit line based on the first bit value and the second bit value.

An embodiment of the present disclosure may provide for a method of operating a page buffer connected to a memory cell through a bit line. The method may include precharging the bit line and a sensing node, performing a first evaluation operation on the sensing node based on a first evaluation time, storing a first bit value, determined based on the first evaluation operation, in a first latch, performing a second evaluation operation based on a second evaluation time longer than the first evaluation time, storing a second bit value determined based on the second evaluation operation in a second latch, performing a third evaluation operation based on a third evaluation time longer than the second evaluation time, storing the first bit value, determined based on the third evaluation operation, in the first latch, determining whether a verify operation has passed, based on the first bit value determined based on the third evaluation operation and the second bit value determined based on the second evaluation operation, and control a voltage that is applied to the bit line, based on the first bit value determined based on the third evaluation operation and the second bit value determined based on the second evaluation operation.

BRIEF DESCRIPTION OF THE DRAWINGS

FIG. 3 is a diagram illustrating an example in which a triple verify program operation is performed according to an embodiment of the present disclosure.

FIG. 5 is a diagram illustrating bit values stored in a first latch and a second latch based on a triple verify program operation according to an embodiment of the present disclosure.

FIG. 12 is a diagram illustrating an example of a page buffer according to an embodiment of the present disclosure.

FIG. 13 is a diagram illustrating a method of performing a triple verify program operation according to an embodiment of the present disclosure.

FIG. 14 is a diagram illustrating a memory device according to an embodiment of the present disclosure.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. In descriptions for time flow relationships of components, an operating method or a fabricating method, in the case where pre and post relationships in terms of time or pre and post relationships in terms of flow are described, for example, by "after," "following," "next" or "before," non-continuous cases may be included unless "immediately" or "directly" is used. Also, in describing the components, signals, values, etc., of the disclosure, there may be terms used like first, second, A, B, (a), and (b). These are solely for the purpose of differentiating one component, signal, value, etc., from another component, signal, value, etc., but do not limit the substances, order, sequence or number of the components signals, values, etc.

Various embodiments of the present disclosure are directed to a page buffer, a memory device including the page buffer, and a method of operating the page buffer, which can improve the threshold voltage distribution of memory cells and reduce a circuit size.

Figure 1:
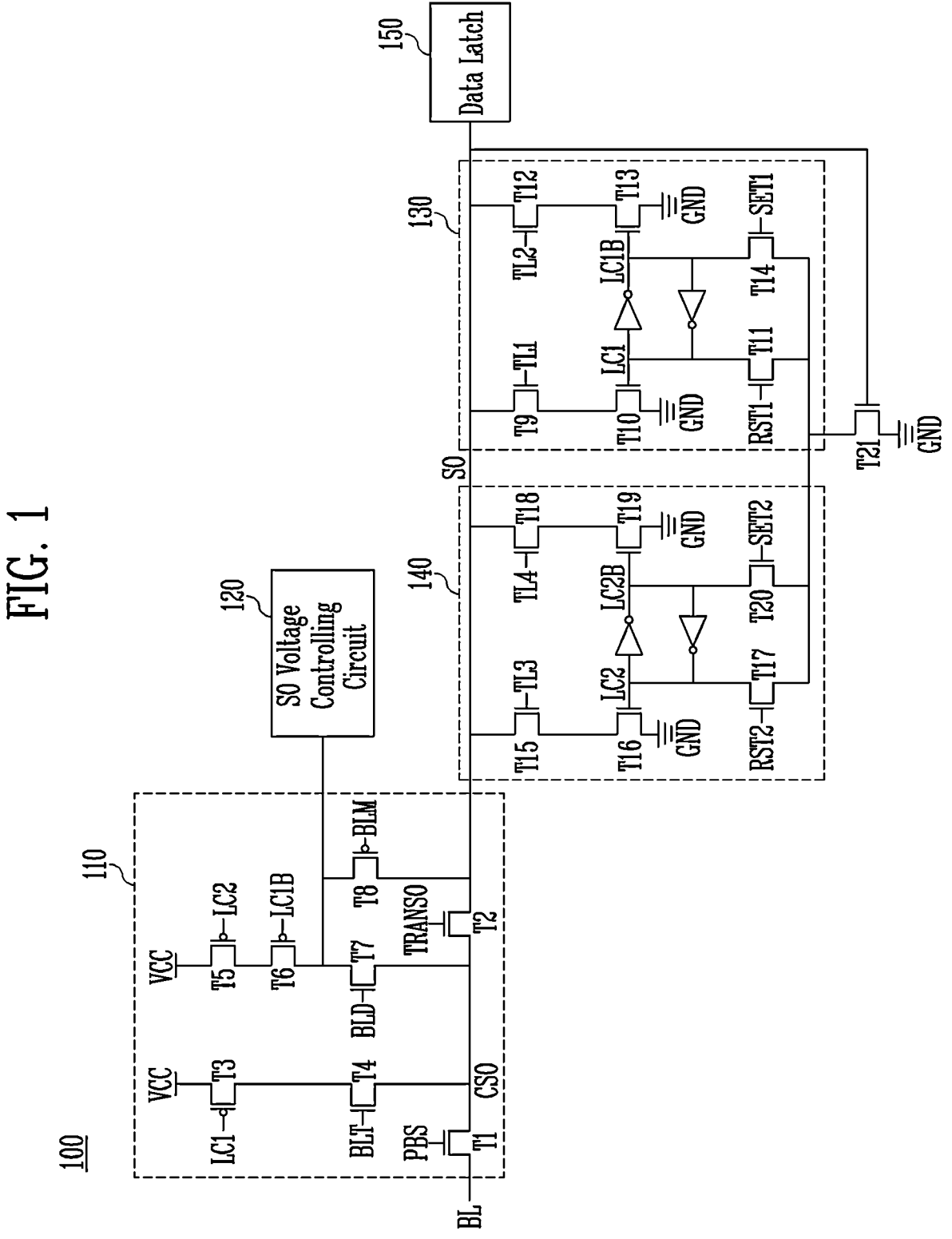
FIG. 1 is a diagram illustrating a page buffer according to an embodiment of the present disclosure.

FIG. 1 is a diagram illustrating a page buffer according to an embodiment of the present disclosure.

Referring to FIG. 1, a page buffer 100 may be coupled to a memory cell through a bit line BL. The page buffer 100 may sense and store data, stored in the memory cell, through the bit line BL during a read operation or a verify operation. Also, the page buffer 100 may store write data provided from an external system during a program operation.

In an embodiment, the page buffer 100 may include a bit line voltage controlling circuit 110, a sensing node (SO) voltage controlling circuit 120, a first latch 130, a second latch 140, and a data latch 150. Further, the page buffer 100 may further include a common sensing node CSO connected to the bit line BL, a sensing node SO connected to the bit line BL through the common sensing node CSO, and a 21-st transistor T21.

In an embodiment, the 21-st transistor T21 may be connected to a ground voltage (ground) GND, an eleventh transistor T11, a fourteenth transistor T14, a seventeenth transistor T17, and a twentieth transistor T20. The 21-st transistor T21 may connect the ground voltage GND to the eleventh transistor T11, the fourteenth transistor T14, the seventeenth transistor T17 or the twentieth transistor T20 in response to the voltage level of the sensing node SO. The 21-st transistor T21 may be implemented as an NMOS transistor.

In an embodiment, the bit line voltage controlling circuit 110 may control a voltage that is applied to the bit line BL. For example, the bit line voltage controlling circuit 110 may precharge the bit line BL to a precharge voltage, or may set the voltage of the bit line BL depending on the verify state of the memory cell while a program voltage is applied to the memory cell.

In an embodiment, the bit line voltage controlling circuit 110 may include first to eighth transistors T1 to T8.

The first transistor T1 may be connected to the bit line and to the common sensing node. The first transistor T1 may electrically connect the bit line BL to the common sensing node CSO in response to a page buffer sensing signal PBS. The first transistor T1 may be implemented as an NMOS transistor.

The second transistor T2 may be connected to the common sensing node CSO and to the sensing node SO. The second transistor T2 may electrically connect the common sensing node CSO to the sensing node SO in response to a sensing node sensing signal TRANSO. The second transistor T2 may be implemented as an NMOS transistor.

The third transistor T3 may be connected to a source of supply voltage VCC and the fourth transistor T4. The third transistor T3 may transfer the supply voltage VCC to the fourth transistor T4 in response to a first bit value LC1 stored in the first latch 130. The third transistor T3 may be implemented as a PMOS transistor.

The fourth transistor T4 may be connected to the third transistor T3 and to the common sensing node CSO. The fourth transistor T4 may transfer a voltage corresponding to a first bit line voltage control signal BLT to the common sensing node CSO in response to the first bit line voltage control signal BLT. The fourth transistor T4 may be implemented as an NMOS transistor.

The fifth transistor T5 may be connected to the source of the supply voltage VCC and the sixth transistor T6. The fifth transistor T5 may transfer the supply voltage VCC to the sixth transistor T6 in response to a second bit value LC2 stored in the second latch 140. The fifth transistor T5 may be implemented as a PMOS transistor.

The sixth transistor T6 may be connected to the fifth transistor T5, the seventh transistor T7, and the eighth transistor T8. The sixth transistor T6 may transfer the supply voltage VCC received from the fifth transistor T5 to the seventh transistor T7 or the eighth transistor T8 in response to a first inverted bit value LC1B that is an inverted value of the first bit value LC1 stored in the first latch 130. The sixth transistor T6 may be implemented as a PMOS transistor.

The seventh transistor T7 may be connected to the sixth transistor T6 and to the common sensing node CSO. The seventh transistor T7 may transfer a voltage corresponding to a second bit line voltage control signal BLD to the common sensing node CSO in response to the second bit line voltage control signal BLD. The seventh transistor T7 may be implemented as an NMOS transistor.

The eighth transistor T8 may be connected to the sixth transistor T6 and to the sensing node SO. The eighth transistor T8 may transfer a voltage corresponding to a third bit line voltage control signal BLM to the common sensing node CSO in response to the third bit line voltage control signal BLM. The eighth transistor T8 may be implemented as a PMOS transistor.

In an embodiment, the sensing node voltage controlling circuit 120 may control the voltage of the sensing node SO. For example, the sensing node voltage controlling circuit 120 may precharge the sensing node SO to the precharge voltage.

In an embodiment, the first latch 130 may store the first bit value LC1 among a plurality of bit values indicating a threshold voltage area in which the memory cell is included during a verify operation.

In an embodiment, the first latch 130 may include ninth to fourteenth transistors T9 to T14.

The ninth transistor T9 may be connected to the sensing node SO and to the tenth transistor T10. The ninth transistor T9 may electrically connect the sensing node SO to the tenth transistor T10 in response to a first latch connection signal TL1. The ninth transistor T9 may be implemented as an NMOS transistor.

The tenth transistor T10 may be connected to the ninth transistor T9 and to the ground voltage GND. The tenth transistor T10 may electrically connect the ninth transistor T9 to the ground voltage GND in response to the first bit value LC1. The tenth transistor T10 may be implemented as an NMOS transistor.

The eleventh transistor T11 may be connected to a node which stores the first bit value LC1 and to the 21-st transistor T21. The eleventh transistor T11 may electrically connect the node which stores the first bit value LC1 to the 21-st transistor T21 in response to a first latch reset signal RST1 among latch control signals for controlling the first latch 130. The eleventh transistor T11 may be implemented as an NMOS transistor.

The twelfth transistor T12 may be connected to the sensing node SO and to the thirteenth transistor T13. The twelfth transistor T12 may electrically connect the sensing node SO to the thirteenth transistor T13 in response to a second latch connection signal TL2. The twelfth transistor T12 may be implemented as an NMOS transistor.

The thirteenth transistor T13 may be connected to the twelfth transistor T12 and to the ground voltage GND. The thirteenth transistor T13 may electrically connect the twelfth transistor T12 to the ground voltage GND in response to the first inverted bit value LC1B. The thirteenth transistor T13 may be implemented as an NMOS transistor.

The fourteenth transistor T14 may be connected to a node which stores the first inverted bit value LC1B and to the 21-st transistor T21. The fourteenth transistor T14 may electrically connect the node which stores the first inverted bit value LC1B to the 21-st transistor T21 in response to a first latch set signal SET1 among the latch control signals for controlling the first latch 130. The fourteenth transistor T14 may be implemented as an NMOS transistor.

In an embodiment, the second latch 140 may store the second bit value LC2 among the plurality of bit values indicating a threshold voltage area in which the memory cell is included during a verify operation.

In an embodiment, the second latch 140 may include fifteenth to twentieth transistors T15 to T20.

The fifteenth transistor T15 may be connected to the sensing node SO and to the sixteenth transistor T16. The fifteenth transistor T15 may electrically connect the sensing node SO to the sixteenth transistor T16 in response to a third latch connection signal TL3. The fifteenth transistor T15 may be implemented as an NMOS transistor.

The sixteenth transistor T16 may be connected to the fifteenth transistor T15 and the ground voltage GND. The sixteenth transistor T16 may electrically connect the fifteenth transistor T15 to the ground voltage GND in response to the second bit value LC2. The sixteenth transistor T16 may be implemented as an NMOS transistor.

The seventeenth transistor T17 may be connected to a node which stores the second bit value LC2 and to the 21-st transistor T21. The seventeenth transistor T17 may electrically connect the node which stores the second bit value LC2 to the 21-st transistor T21 in response to a second latch reset signal RST2 among latch control signals for controlling the second latch 140. The seventeenth transistor T17 may be implemented as an NMOS transistor.

The eighteenth transistor T18 may be connected to the sensing node SO and to the nineteenth transistor T19. The eighteenth transistor T18 may electrically connect the sensing node SO to the nineteenth transistor T19 in response to a fourth latch connection signal TL4. The eighteenth transistor T18 may be implemented as an NMOS transistor.

The nineteenth transistor T19 may be connected to the eighteenth transistor T18 and the ground voltage GND. The nineteenth transistor T19 may electrically connect the eighteenth transistor T18 to the ground voltage GND in response to a second inverted bit value LC2B that is an inverted value of the second bit value LC2. The nineteenth transistor T19 may be implemented as an NMOS transistor.

The twentieth transistor T20 may be connected to a node which stores the second inverted bit value LC2B and to the 21-st transistor T21. The twentieth transistor T20 may electrically connect the node which stores the second inverted bit value LC2B to the 21-st transistor T21 in response to a second latch set signal SET2 among the latch control signals for controlling the second latch 140. The twentieth transistor T20 may be implemented as an NMOS transistor.

In an embodiment, the data latch 150 may store data read from the memory cell.

Figure 2:
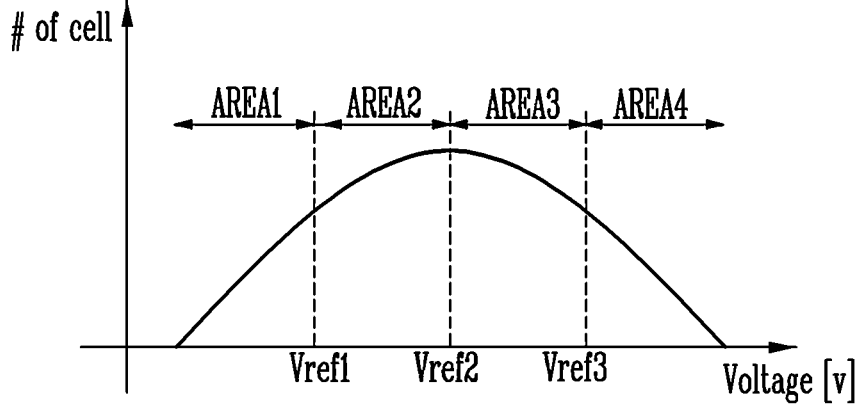
FIG. 2 is a diagram illustrating threshold voltage areas of memory cells according to an embodiment of the present disclosure.

FIG. 2 is a diagram illustrating threshold voltage areas of memory cells according to an embodiment of the present disclosure. The horizontal axis of a graph illustrated in FIG. 2 may denote the magnitude of a potential difference expressed in volts, and the vertical axis of the graph may denote the number of memory cells.

Referring to FIG. 2, each memory cell may correspond to any one of a plurality of threshold voltage areas AREA1 to AREA4 after a program voltage is applied. The memory cell may be a slow cell or a fast cell. When the same program voltage is applied to the slow cell and the fast cell, variation in the threshold voltage of the fast cell may be greater than variation in the threshold voltage of the slow cell. Therefore, the threshold voltage area in which the memory cell is included may change depending on whether the memory cell is the slow cell or the fast cell.

In an embodiment, the plurality of threshold voltage areas AREA1 to AREA4 may be divided based on a plurality of reference voltages Vref1 to Vref3. The first threshold voltage area AREA1 may be an area lower than the first reference voltage Vref1. The second threshold voltage area AREA2 may be an area higher than the first reference voltage Vref1 and lower than the second reference voltage Vref2. The third threshold voltage area AREA3 may be an area higher than the second reference voltage Vref2 and lower than the third reference voltage Vref3. The fourth threshold voltage area AREA4 may be an area higher than the third reference voltage Vref3.

In an embodiment, a verify operation may be performed based on a triple verify method. For example, the verify operation may be composed of three verify operations, and a threshold voltage area in which the memory cell is included may be determined among the plurality of threshold voltage areas AREA1 to AREA4 through the three verify operations. An example in which the verify operation is performed will be described in detail later with reference to FIGS. 3 and 4 to be described later.

In an embodiment, when the memory cell is included in the fourth threshold voltage area, the memory cell may be determined to have passed the verify operation (i.e., verify pass). In contrast, when the memory cell is not included in the fourth threshold voltage area, the memory cell may be determined not to have passed the verify operation, and a next program loop may be performed.

During a program voltage apply operation in the next program loop after the verify operation, the voltage to be applied to the bit line may be determined depending on the threshold voltage area in which the memory cell is included. This will be described in detail later with reference to FIGS. 6 to 11 to be described later.

Figure 3:
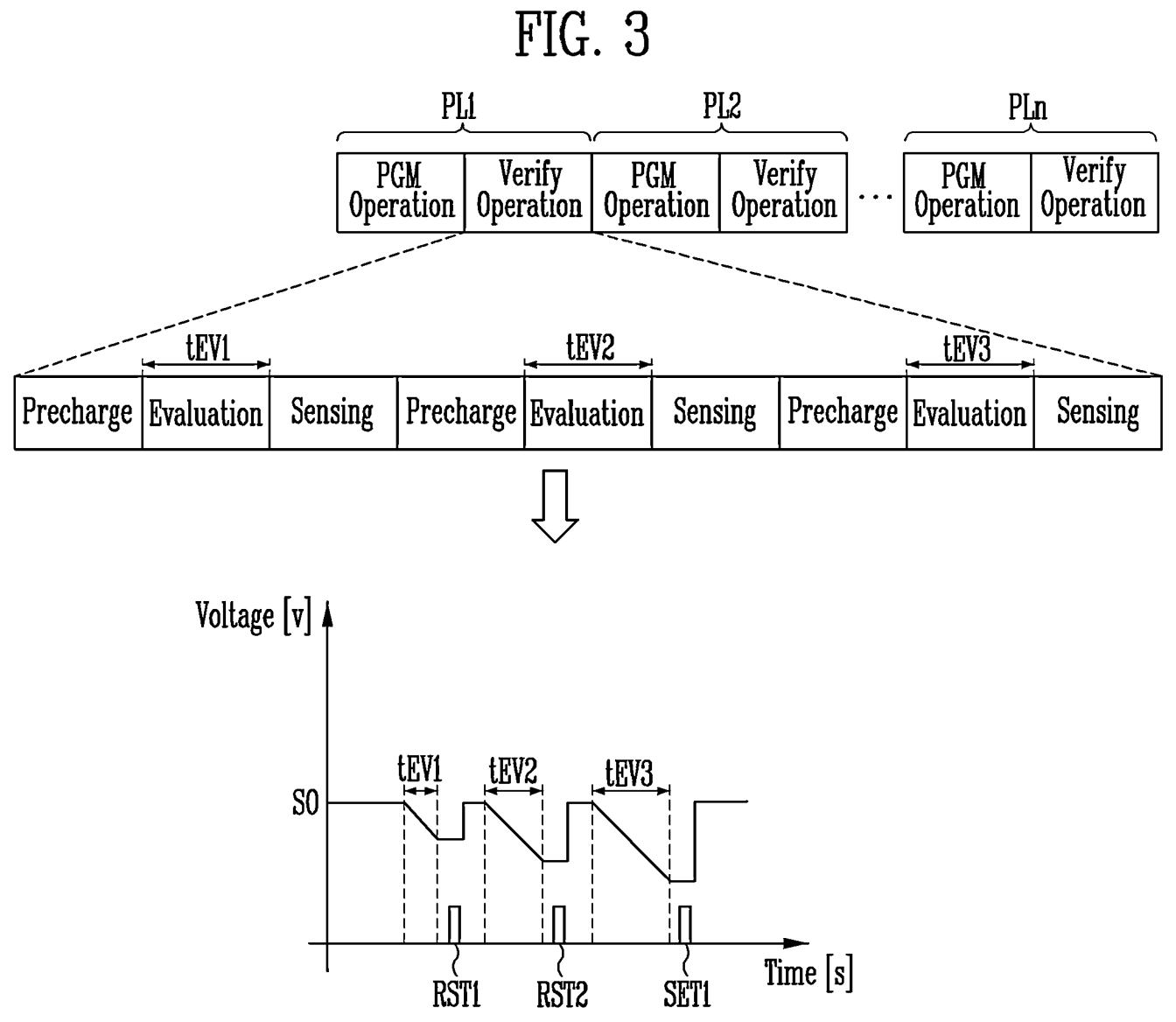

FIG. 3 is a diagram illustrating an example in which a triple verify program operation is performed according to an embodiment of the present disclosure. The horizontal axis of a graph illustrated in FIG. 3 may denote time expressed in seconds S, and the vertical axis of the graph may denote the magnitude of a potential difference expressed in volts.

Referring to FIGS. 1 and 3, the program operation may include a plurality of program loops PL1 to PLn. Each of selected memory cells may be programmed to have a threshold voltage corresponding to any one of a plurality of program states through the plurality of program loops PL1 to PLn.

Each of the plurality of program loops PL1 to PLn may include a program voltage apply operation (PGM operation) of providing a program voltage and a verify operation of applying verify voltages and verifying whether memory cells have been programmed.

For example, when the first program loop PL1 is performed, the verify voltages may be sequentially applied to verify program states of the plurality of memory cells in the verify operation after a first program voltage is applied in the program voltage apply operation (PGM Operation).

Memory cells having passed the verify operation through respective verify voltages may be determined to have target program states, and may then be program-inhibited in a subsequent second program loop PL2. In order to program the remaining memory cells other than program-inhibited memory cells in the second program loop PL2, a second program voltage higher than the first program voltage by a unit (step) voltage may be applied. Thereafter, a verify operation may be performed in the same way as the verify operation performed in the first program loop PL1. In an example, the term "verify pass" may indicate that the memory cell is read as an off-cell by the corresponding verify voltage.

During the program voltage apply operation (PGM Operation), when the program voltage is applied to a selected word line, the page buffer 100 may transfer data received through the input/output circuit to the selected memory cells through the bit line BL. Memory cells in a selected page may be programmed based on the transferred data. A memory cell coupled to a bit line BL to which a program-enable voltage (e.g., a ground voltage or a voltage higher than the ground voltage) is applied may have an increased threshold voltage. The threshold voltage of a memory cell coupled to a bit line BL to which a program-inhibit voltage (e.g., a supply voltage) is applied may be maintained.

During the verify operation, the verify voltage may be applied to a selected word line coupled to the selected memory cells, and the page buffer 100 may sense currents or voltages flowing through the bit lines BL coupled to the selected memory blocks, respectively.

For example, the page buffer 100 may store the state of a memory cell depending on the voltage of the corresponding bit line BL. Here, the state of the memory cell may be a state corresponding to any one of 'verify pass' and 'verify fail'. When the threshold voltage of the memory cell is higher than the verify voltage applied to the selected word line, the memory cell may be read as an off-cell, and the memory cell read as the off-cell may correspond to the pass state. On the other hand, when the threshold voltage of the memory cell is lower than the verify voltage applied to the selected word line, the memory cell may be read as an on-cell, and the memory cell read as the on-cell may correspond to the fail state.

In an embodiment, the verify operation may include a first verify operation based on a first evaluation operation, a second verify operation based on a second evaluation operation, and a third verify operation based on a third evaluation operation depending on the triple verify program method. Here, each of the first verify operation, the second verify operation, and the third verify operation may include a precharge operation (Precharge), an evaluation operation (Evaluation), and a sensing operation (Sensing).

The precharge operation (Precharge) may be an operation of precharging the bit line BL and the sensing node SO.

In an embodiment, the bit line voltage controlling circuit 110 may precharge the bit line BL. Also, the sensing node voltage controlling circuit 120 may precharge the sensing node SO while the bit line BL is precharged.

The evaluation operation (Evaluation) may be an operation of evaluating the threshold voltage of the memory cell depending on the voltage or current of the bit line BL. An evaluation time for the evaluation operation (Evaluation) may be set to a time during which the threshold voltage of the memory cell may be reflected in the bit line BL.

In an embodiment, the first evaluation operation may be performed based on a first evaluation time tEV1. The second evaluation operation may be performed based on a second evaluation time tEV2 longer than the first evaluation time tEV1. The third evaluation operation may be performed based on a third evaluation time tEV3 longer than the second evaluation time tEV2.

The sensing operation (Sensing) may be an operation of sensing data based on the voltage or current of the bit line BL while the verify voltage is applied to the memory cell, and storing the sensed data in the first latch 130 and the second latch 140 of the page buffer 100. For example, when change in the voltage or current of the bit line BL is reflected in the sensing node SO, the first latch 130 may store a first bit value LC1 among a plurality of bit values corresponding to the voltage level of the sensing node SO in response to a latch control signal, and the second latch 140 may store a second bit value LC2 among the plurality of bit values corresponding to the voltage level of the sensing node SO in response to the latch control signal.

In an embodiment, the bit line BL and the sensing node SO may be precharged. Thereafter, the first evaluation operation may be performed during the first evaluation time tEV1 from a time point at which the precharging of the sensing node SO is completed. Thereafter, the first latch 130 may store the first bit value LC1 determined based on the first evaluation operation. For example, the first latch 130 may store the first bit value LC1 determined based on the first evaluation operation in response to a first latch reset signal RST1 after the first evaluation operation is completed.

Further, the sensing node voltage controlling circuit 120 may re-precharge the sensing node SO after the first bit value LC1 is stored in the first latch 130. Thereafter, the second evaluation operation may be performed during the second evaluation time tEV2 from a time point at which re-precharging of the sensing node SO is completed after the first bit value LC1 is stored in the first latch 130. Thereafter, the second latch 140 may store the second bit value LC2 determined based on the second evaluation operation. For example, the second latch 140 may store the second bit value LC2 determined based on the second evaluation operation in response to a second latch reset signal RST2 after the second evaluation operation is completed.

Further, the sensing node voltage controlling circuit 120 may re-precharge the sensing node SO after the second bit value LC2 is stored in the second latch 140. Thereafter, the third evaluation operation may be performed during the third evaluation time tEV3 from a time point at which re-precharging of the sensing node SO is completed after the second bit value LC2 is stored in the second latch 140. Thereafter, the first latch 130 may store the first bit value LC1 determined based on the third evaluation operation. For example, the first latch 130 may store the first bit value LC1 determined based on the third evaluation operation in response to a first latch set signal SET1 after the third evaluation operation is completed.

Figure 4:
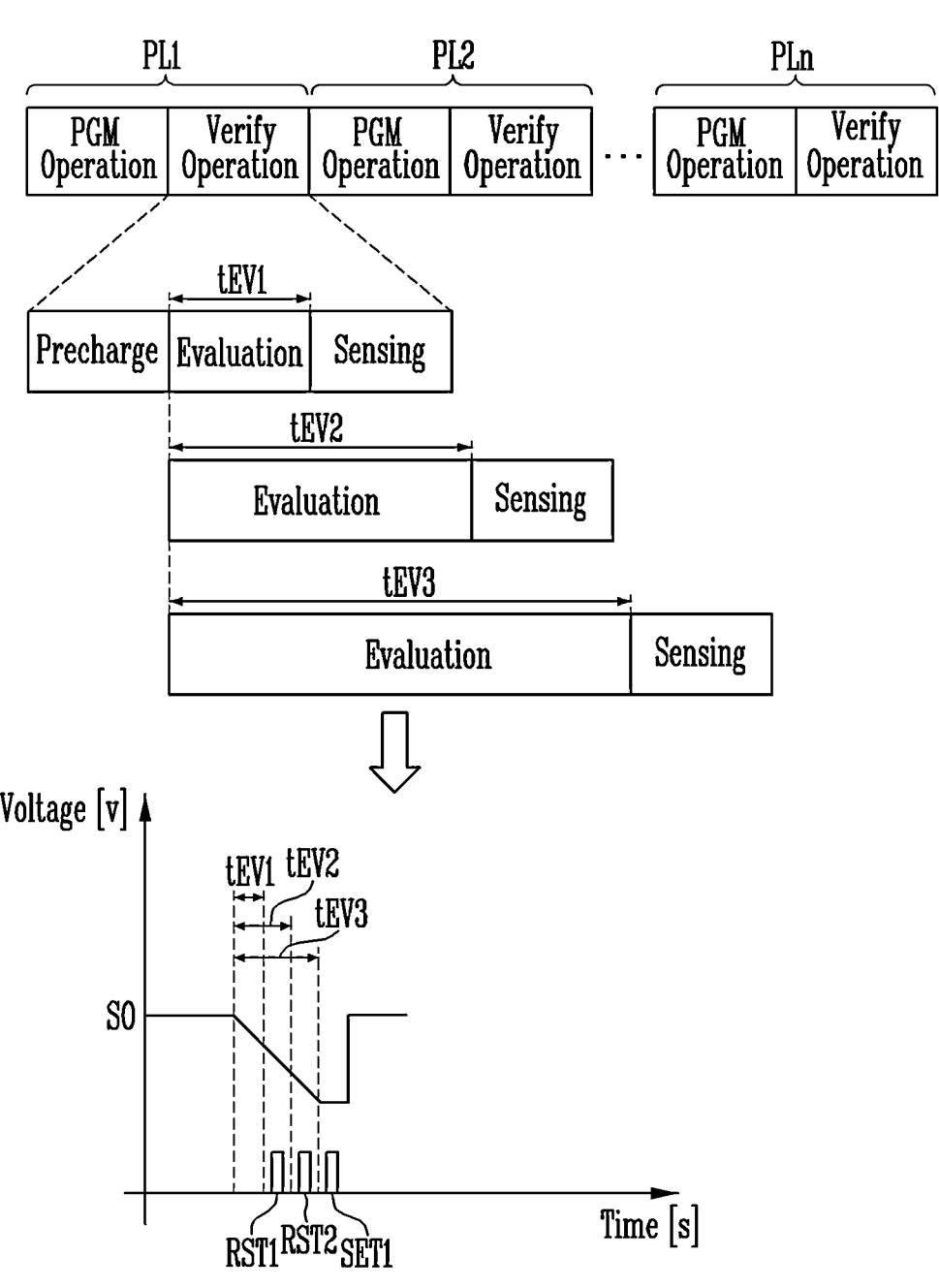
FIG. 4 is a diagram illustrating an example in which a triple verify program operation is performed according to an embodiment of the present disclosure.

FIG. 4 is a diagram illustrating an example in which a triple verify program operation is performed according to an embodiment of the present disclosure. The horizontal axis of a graph illustrated in FIG. 4 may denote time expressed in seconds S, and the vertical axis of the graph may denote the magnitude of a potential difference expressed in volts. In detail, compared to the triple verify program operation illustrated in FIG. 3, the triple verify program operation illustrated in FIG. 4 is configured such that a precharge operation is performed only once.

Referring to FIGS. 1 and 4, in an embodiment, the bit line BL and the sensing node SO may be precharged. Thereafter, the first evaluation operation may be performed during the first evaluation time tEV1 from a time point at which precharging of the sensing node SO is completed. Thereafter, the first latch 130 may store the first bit value LC1 determined based on the first evaluation operation. For example, the first latch 130 may store the first bit value LC1 determined based on the first evaluation operation in response to a first latch reset signal RST1 after the first evaluation operation is completed.

Further, the second evaluation operation may be performed during the second evaluation time tEV2 from a time point at which the precharging of the sensing node SO is completed. Thereafter, the second latch 140 may store the second bit value LC2 determined based on the second evaluation operation. For example, the second latch 140 may store the second bit value LC2 determined based on the second evaluation operation in response to a second latch reset signal RST2 after the second evaluation operation is completed.

Furthermore, the third evaluation operation may be performed during the third evaluation time tEV3 from a time point at which the precharging of the sensing node SO is completed. Thereafter, the first latch 130 may store the first bit value LC1 determined based on the third evaluation operation. For example, the first latch 130 may store the first bit value LC1 determined based on the third evaluation operation in response to a first latch set signal SET1 after the third evaluation operation is completed.

FIG. 5 is a diagram illustrating bit values stored in a first latch and a second latch based on a triple verify program operation according to an embodiment of the present disclosure.

Referring to FIGS. 1, 2, and 5, first latch status information Latch Status1 may be status information indicating bit values stored in the first latch 130 and the second latch 140 after the first evaluation operation and a sensing operation based on the first evaluation operation are performed.

In an embodiment, the page buffer 100 may store an initial logic value in the first latch 130 and the second latch 140 before the evaluation operation is performed. Here, the initial logic value may indicate '1'. In an embodiment, the first logic value may be the initial logic value indicating '1', and the second logic value may indicate '0' that is an inverted value of the first logic value.

For example, the first latch 130 and the second latch 140 may turn off the ninth transistor T9, the twelfth transistor T12, the fifteenth transistor T15, and the eighteenth transistor T18. Also, the sensing node voltage controlling circuit 120 may precharge the sensing node SO to have a high voltage level. Further, the first latch 130 and the second latch 140 may store the first bit value and the second bit value as '1' that is the initial logic value in response to the first latch set signal SET1 and the second latch set signal SET2.

Meanwhile, in the present specification, it is assumed that the initial logic value is '1', but the present disclosure is not limited thereto. In accordance with an embodiment, the first logic value that is the initial logic value may indicate '0', and the second logic value may indicate '1'.

In an embodiment, when the memory cell is included in the first threshold voltage area AREA1, the first bit value LC1 may be maintained at the first logic value that is the initial logic value depending on the sensing operation based on the first evaluation operation. Unlike this, when the memory cell is included in any one of the second threshold voltage area AREA2, the third threshold voltage area AREA3, and the fourth threshold voltage area AREA4, the first bit value LC1 may change from the first logic value to the second logic value depending on the sensing operation based on the first evaluation operation.

The second latch status information Latch Status2 may be status information indicating bit values stored in the first latch 130 and the second latch 140 after the second evaluation operation and a sensing operation based on the second evaluation operation are performed.

In an embodiment, when the memory cell is included in any one of the first threshold voltage area AREA1 and the second threshold voltage area AREA2, the second bit value LC2 may be maintained at the first logic value that is the initial logic value depending on the sensing operation based on the second evaluation operation. Unlike this, when the memory cell is included in any one of the third threshold voltage area AREA3 and the fourth threshold voltage area AREA4, the second bit value LC2 may change from the first logic value to the second logic value depending on the sensing operation based on the second evaluation operation.

The third latch status information Latch Status3 may be status information indicating bit values stored in the first latch 130 and the second latch 140 after the third evaluation operation and a sensing operation based on the third evaluation operation are performed.

In an embodiment, when the memory cell is included in any one of the first threshold voltage area AREA1, the second threshold voltage area AREA2, and the third threshold voltage area AREA3, the first bit value LC1 may be maintained at the previous logic value depending on the sensing operation based on the third evaluation operation. For example, when the memory cell is included in the first threshold voltage area AREA1, the first bit value LC1 may correspond to the first logic value. Further, when the memory cell is included in any one of the second threshold voltage area AREA2 and the third threshold voltage area AREA3, the first bit value LC1 may correspond to the second logic value. In contrast, when the memory cell is included in the fourth threshold voltage area AREA4, the first bit value LC1 may change from the second logic value to the first logic value depending on the sensing operation based on the third evaluation operation.

In an embodiment, when the first bit value LC1 corresponds to the first logic value and the second bit value LC2 corresponds to the second logic value depending on the third latch status information Latch Status3, the memory cell may be included in the fourth threshold voltage area to pass the verify operation. In this case, the data latch 150 may store data indicating whether the verify operation has passed. Accordingly, the corresponding memory cell may be set to a program-inhibited cell.

Figure 6:
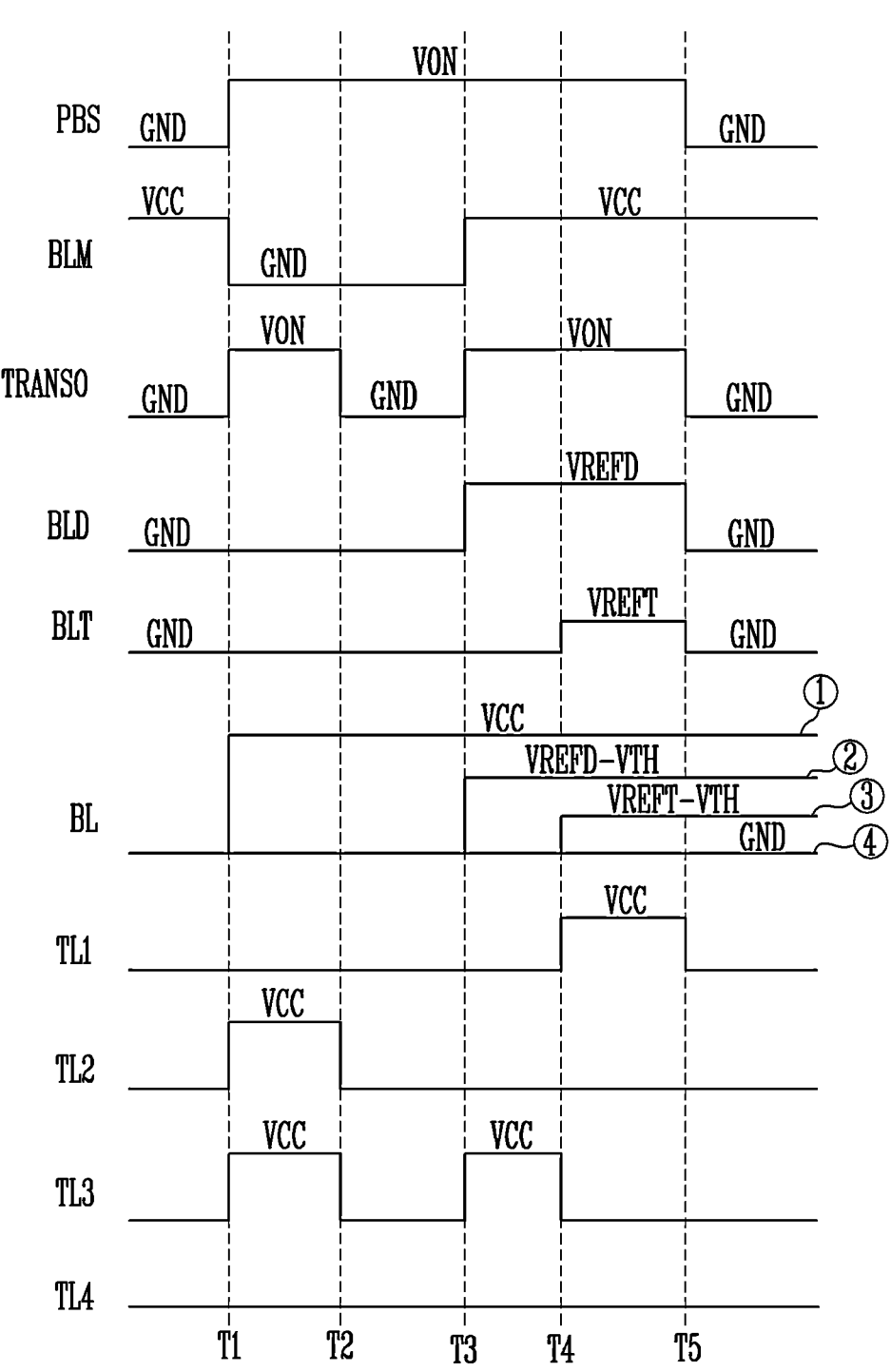
FIG. 6 is a timing diagram indicating a bit line setup operation according to an embodiment of the present disclosure.

FIG. 6 is a timing diagram indicating a bit line setup operation according to an embodiment of the present disclosure.

Referring to FIGS. 1 and 6, the bit line voltage controlling circuit 110 may control voltages that are applied to the bit line BL based on the first bit value LC1 and the second bit value LC2 during a program voltage apply operation after a verify operation. For example, the bit line voltage controlling circuit 110 may apply any one of a ground voltage GND, a first program-enable voltage, a second program-enable voltage, and a program-inhibit voltage to the bit line BL depending on whether each of the first bit value LC1 and the second bit value LC2 corresponds to any one of a first logic value and a second logic value.

The first program-enable voltage may be a voltage corresponding to a first bit line voltage control signal BLT, and may be higher than the ground voltage GND. For example, the first program-enable voltage may be represented by the difference between a voltage VREFT applied to the fourth transistor T4 in response to the first bit line voltage control signal BLT and the threshold voltage VTH of the fourth transistor T4.

The second program-enable voltage may be a voltage corresponding to a second bit line voltage control signal BLD, and may be higher than the first program-enable voltage. For example, the second program-enable voltage may be represented by the difference between a voltage VREFD applied to the seventh transistor T7 in response to the second bit line voltage control signal BLD and the threshold voltage VTH of the seventh transistor T7.

The program-inhibit voltage may be a voltage corresponding to a third bit line voltage control signal BLM, and may be higher than the second program-enable voltage. For example, the program-inhibit voltage may indicate a supply voltage VCC applied to the eighth transistor T8 in response to the third bit line voltage control signal BLM.

Descriptions of signals corresponding to respective time points, illustrated in FIG. 6, will be made with reference to FIGS. 7, 9, and 11 to be described below.

Figure 7:
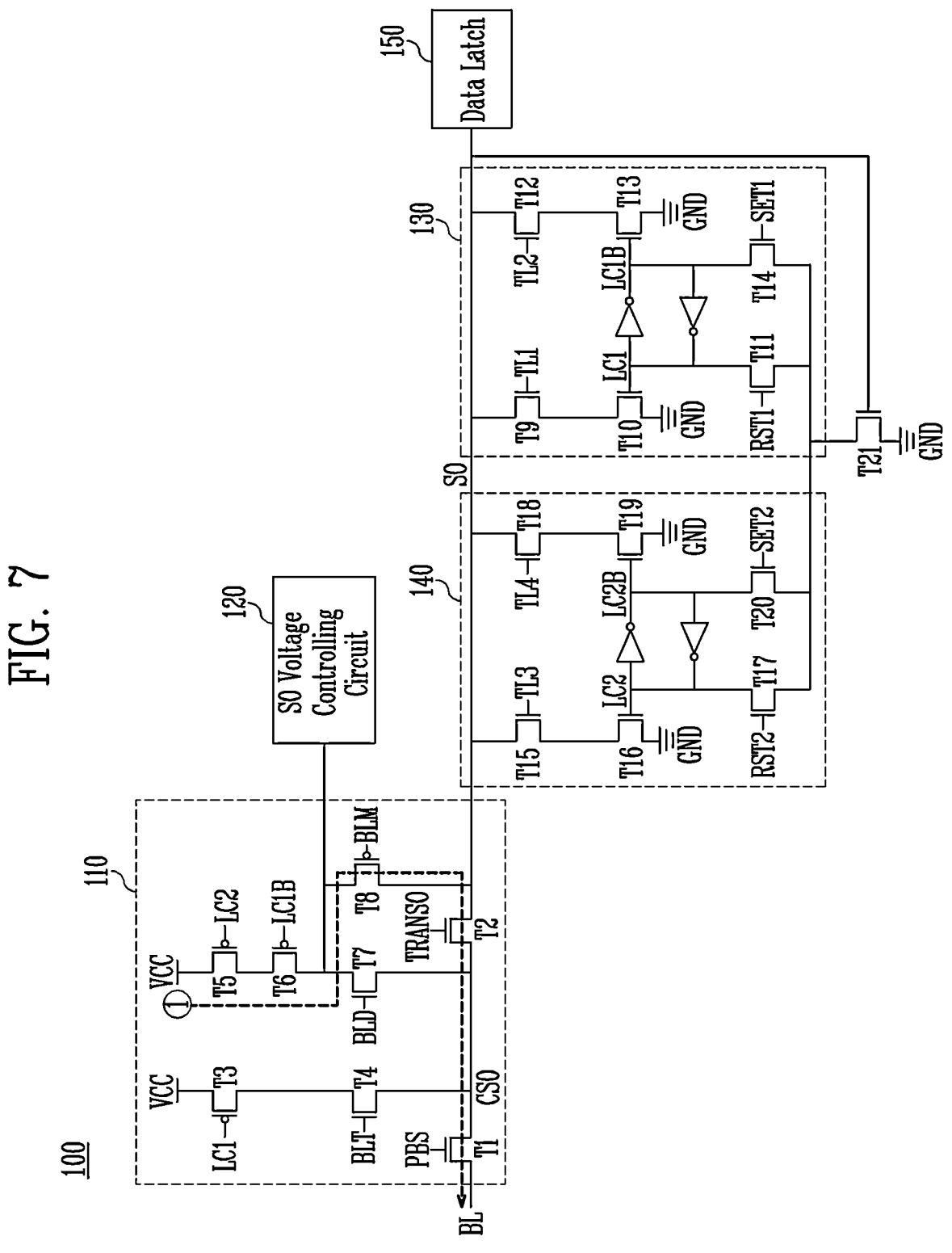
FIG. 7 is a diagram illustrating an example in which the bit line voltage of a memory cell included in a fourth threshold voltage area is controlled according to an embodiment of the present disclosure.

FIG. 7 is a diagram illustrating an example in which the bit line voltage of a memory cell included in a fourth threshold voltage area is controlled according to an embodiment of the present disclosure.

Referring to FIGS. 5, 6, and 7, when the memory cell is included in the fourth threshold voltage area AREA4, the first bit value LC1 may correspond to a first logic value and the second bit value LC2 may correspond to a second logic value depending on third latch status information Latch Status3.

During a period from T1 to T3, the bit line voltage controlling circuit 110 may apply the program-inhibit voltage corresponding to the third bit line voltage control signal BLM to the bit line BL by turning on the first transistor T1, the second transistor T2, the fifth transistor T5, the sixth transistor T6, and the eighth transistor T8.

For example, during a period from T1 to T2, the first transistor T1 may receive a voltage VON in response to a page buffer sensing signal PBS, and may connect the bit line BL to the common sensing node CSO.

The second transistor T2 may receive the voltage VON in response to a sensing node sensing signal TRANSO, and may connect the common sensing node CSO to the sensing node SO.

When the second bit value LC2 corresponds to the second logic value, the fifth transistor T5 may transfer the supply voltage VCC to the sixth transistor T6.

Because the first inverted bit value LC1B corresponds to the second logic value when the first bit value LC1 corresponds to the first logic value, the sixth transistor T6 may transfer the supply voltage VCC received from the fifth transistor T5 to the eighth transistor T8.

The eighth transistor T8 may receive the supply voltage VCC in response to the third bit line voltage control signal BLM, and may transfer the supply voltage VCC to the sensing node SO.

Accordingly, the bit line voltage controlling circuit 110 may apply the supply voltage VCC corresponding to the program-inhibit voltage to the bit line BL through path ①.

Also, the third transistor T3, the fourth transistor T4, and the seventh transistor T7 may be turned off.

Meanwhile, the twelfth transistor T12 and the fifteenth transistor T15 may be turned on in response to a second latch connection signal TL2 and a third latch connection signal TL3, and the ninth transistor T9 and the eighteenth transistor T18 may be turned off in response to a first latch connection signal TL1 and a fourth latch connection signal TL4.

In this case, when the memory cell is included in the fourth threshold voltage area AREA4, the thirteenth transistor T13 and the sixteenth transistor T16 may be turned off by receiving a low-level signal depending on the third latch status information Latch Status3. Accordingly, the ground voltage GND connected to the thirteenth transistor T13 and the sixteenth transistor T16 might not be transferred to the sensing node SO, and the program-inhibit voltage may be applied to the bit line BL through path ①.

Unlike this, when the memory cell is included in any one of the first threshold voltage area AREA1, the second threshold voltage area AREA2, and the third threshold voltage area AREA3, at least one of the thirteenth transistor T13 and the sixteenth transistor T16 may be turned on by receiving a high-level signal. Accordingly, the sensing node SO may receive the ground voltage GND through at least one of the thirteenth transistor T13 and the sixteenth transistor T16, and the ground voltage GND may be applied to the bit line BL through the sensing node SO.

During a period from T2 to T3, the second transistor T2 may receive the ground voltage GND in response to the sensing node sensing signal TRANSO, and may disconnect the common sensing node CSO from the sensing node SO.

The twelfth transistor T12 and the fifteenth transistor T15 may be turned off in response to the second latch connection signal TL2 and the third latch connection signal TL3.

Figure 8:
FIG. 8 is a diagram illustrating an example in which a bit value stored in a first latch is changed before the bit line voltage of a memory cell included in a third threshold voltage area is controlled according to an embodiment of the present disclosure.

FIG. 8 is a diagram illustrating an example in which a bit value stored in a first latch is changed before the bit line voltage of a memory cell included in a third threshold voltage area is controlled according to an embodiment of the present disclosure. Although not illustrated in FIG. 6, the example illustrated in FIG. 8 may be performed after the bit line voltage of the memory cell included in the fourth threshold voltage area AREA4, described above with reference to FIG. 7, is controlled.

Referring to FIGS. 1 and 8, before the bit line voltage of the memory cell included in the third threshold voltage area AREA3 is controlled, the page buffer 100 corresponding to the memory cell included in the third threshold voltage area AREA3 may change the first bit value LC1 stored in the first latch 130.

For example, the sensing node voltage controlling circuit 120 may precharge the sensing node SO to a high level. Further, the second latch 140 may turn on the fifteenth transistor T15. The ninth transistor T9, the twelfth transistor T12, and the eighteenth transistor T18 may be turned off.

Here, in the case of the page buffer 100 in which the memory cell is included in any one of the first threshold voltage area AREA1 and the second threshold voltage area AREA2, the sixteenth transistor T16 may be turned on by receiving a high-level signal, whereby the sensing node SO may be discharged by the ground voltage GND.

Unlike this, in the case of the page buffer 100 in which the memory cell is included in any one of the third threshold voltage area AREA3 and the fourth threshold voltage area AREA4, the sixteenth transistor T16 may be turned off by receiving a low-level signal. Because the ground voltage GND connected to the sixteenth transistor T16 is not transferred to the sensing node SO, the sensing node SO may be maintained at high level. In this case, when the first latch set signal SET1 is activated to high level, the page buffer 100 in which the memory cell is included in the third threshold voltage area AREA3 may be operated such that the first bit value LC1 changes to the first logic value. In the case of the page buffer 100 in which the memory cell is included in the fourth threshold voltage area AREA4, the first bit value LC1 may be maintained at the first logic value.

The fourth latch status information Latch Status4 may be status information indicating bit values stored in the first latch 130 and the second latch 140 after the first bit value LC1 has changed to the first logic value for the page buffer 100 in which the memory cell is included in the third threshold voltage area AREA3.

Figure 9:
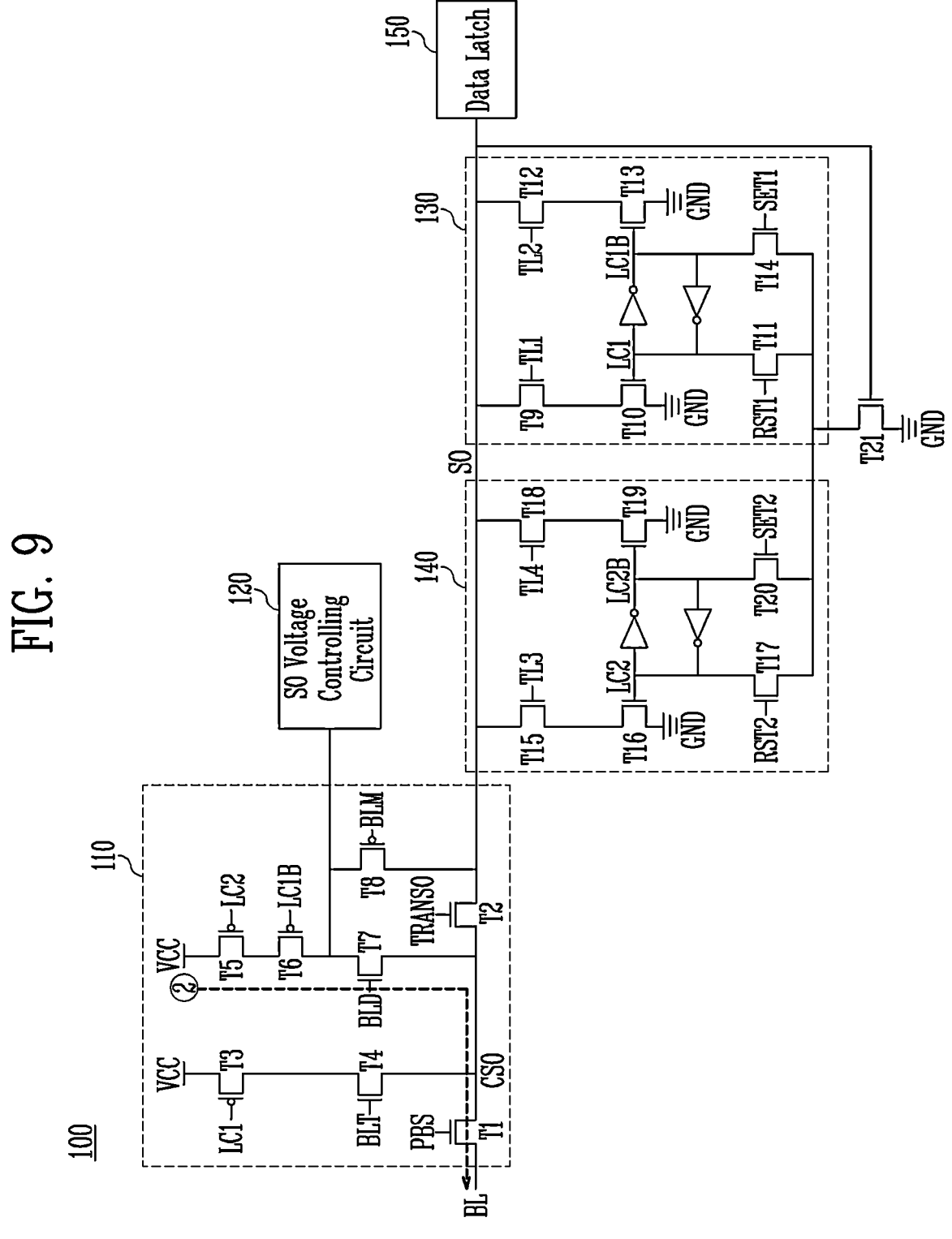
FIG. 9 is a diagram illustrating an example in which the bit line voltage of a memory cell included in a third threshold voltage area is controlled according to an embodiment of the present disclosure.

FIG. 9 is a diagram illustrating an example in which the bit line voltage of a memory cell included in a third threshold voltage area is controlled according to an embodiment of the present disclosure.

Referring to FIGS. 6, 8, and 9, when the memory cell is included in the third threshold voltage area AREA3, the first bit value LC1 may correspond to a first logic value and the second bit value LC2 may correspond to a second logic value depending on the fourth latch status information Latch Status4.

During a period from T3 to T4, the bit line voltage controlling circuit 110 may apply the second program-enable voltage corresponding to the second bit line voltage control signal BLD to the bit line BL by turning on the first transistor T1, the fifth transistor T5, the sixth transistor T6, and the seventh transistor T7.

For example, the first transistor T1 may receive a voltage VON in response to a page buffer sensing signal PBS, and may connect the bit line BL to the common sensing node CSO.

When the second bit value LC2 corresponds to the second logic value, the fifth transistor T5 may transfer the supply voltage VCC to the sixth transistor T6.

Because the first inverted bit value LC1B corresponds to the second logic value when the first bit value LC1 corresponds to the first logic value, the sixth transistor T6 may transfer the supply voltage VCC received from the fifth transistor T5 to the seventh transistor T7.

The seventh transistor T7 may receive the voltage VREFD in response to the second bit line voltage control signal BLD, and may transfer the voltage VREFD to the common sensing node CSO.

Accordingly, the bit line voltage controlling circuit 110 may apply a voltage VREFD-VTH corresponding to the second program-enable voltage to the bit line BL through path ②.

Also, the third transistor T3, the fourth transistor T4, and the eighth transistor T8 may be turned off.

Meanwhile, the second transistor T2 may receive the voltage VON in response to a sensing node sensing signal TRANSO, and may connect the common sensing node CSO to the sensing node SO. The fifteenth transistor T15 may be turned on in response to the third latch connection signal TL3, and the ninth transistor T9, the twelfth transistor T12, and the eighteenth transistor T18 may be turned off in response to the first latch connection signal TL1, the second latch connection signal TL2, and the fourth latch connection signal TL4.

In this case, when the memory cell is included in any one of the third threshold voltage area AREA3 and the fourth threshold voltage area AREA4, the sixteenth transistor T16 may be turned off by receiving a low-level signal depending on the fourth latch status information Latch Status4. Accordingly, the ground voltage GND connected to the sixteenth transistor T16 might not be transferred to the sensing node SO, and the second program-enable voltage may be applied to the bit line BL through path ②. When the memory cell is included in the fourth threshold voltage area AREA4, the program-inhibit voltage higher than the second program-enable voltage is applied to the bit line BL, whereby the bit line BL may be maintained at the program-inhibit voltage.

Unlike this, when the memory cell is included in any one of the first threshold voltage area AREA1 and the second threshold voltage area AREA2, the sixteenth transistor T16 may be turned on by receiving a high-level signal. Accordingly, the sensing node SO may receive the ground voltage GND through the sixteenth transistor T16, and the ground voltage GND may be applied to the bit line BL through the sensing node SO.

Figure 10:
FIG. 10 is a diagram illustrating an example in which a bit value stored in a first latch is changed before the bit line voltage of a memory cell included in any one of a first threshold voltage area and a second threshold voltage area is controlled according to an embodiment of the present disclosure.

FIG. 10 is a diagram illustrating an example in which a bit value stored in a first latch is changed before the bit line voltage of a memory cell included in any one of a first threshold voltage area and a second threshold voltage area is controlled according to an embodiment of the present disclosure. Although not illustrated in FIG. 6, the example illustrated in FIG. 10 may be performed after the bit line voltage of the memory cell included in the third threshold voltage area AREA3, described above with reference to FIG. 8 is controlled.

Further, the example illustrated in FIG. 10 may be performed for a short time (e.g., 1 to 2 μs) just before T4 of FIG. 6. For example, although not illustrated in FIG. 6, the ground voltage GND may be applied in response to the sensing node sensing signal TRANSO and the operation described with reference to FIG. 10 may be performed, for the short time just before T4.

Referring to FIGS. 1 and 10, before the bit line voltage of the memory cell included in any one of the first threshold voltage area AREA1 and the second threshold voltage area AREA2 is controlled, the page buffer 100 corresponding to the memory cell included in any one of the third threshold voltage area AREA3 and the fourth threshold voltage area AREA4 may change the first bit value LC1 stored in the first latch 130.

For example, the sensing node voltage controlling circuit 120 may precharge the sensing node SO to a high level. Further, the second latch 140 may turn on the fifteenth transistor T15. The ninth transistor T9, the twelfth transistor T12, and the eighteenth transistor T18 may be turned off.

Here, in the case of the page buffer 100 in which the memory cell is included in any one of the first threshold voltage area AREA1 and the second threshold voltage area AREA2, the sixteenth transistor T16 may be turned on by receiving a high-level signal, whereby the sensing node SO may be discharged by the ground voltage GND.

Unlike this, in the case of the page buffer 100 in which the memory cell is included in any one of the third threshold voltage area AREA3 and the fourth threshold voltage area AREA4, the sixteenth transistor T16 may be turned off by receiving a low-level signal. Because the ground voltage GND connected to the sixteenth transistor T16 is not transferred to the sensing node SO, the sensing node SO may be maintained at high level. In this case, when the first latch reset signal RST1 is activated to high level, the page buffer 100 in which the memory cell is included in any one of the third threshold voltage area AREA3 and the fourth threshold voltage area AREA4 may be operated such that the first bit value LC1 changes to the second logic value.

Fifth latch status information Latch Status5 may be status information indicating bit values stored in the first latch 130 and the second latch 140 after the first bit value LC1 has changed to the second logic value for the page buffer 100 in which the memory cell is included in any one of the third threshold voltage area AREA3 and the fourth threshold voltage area AREA4.

Figure 11:
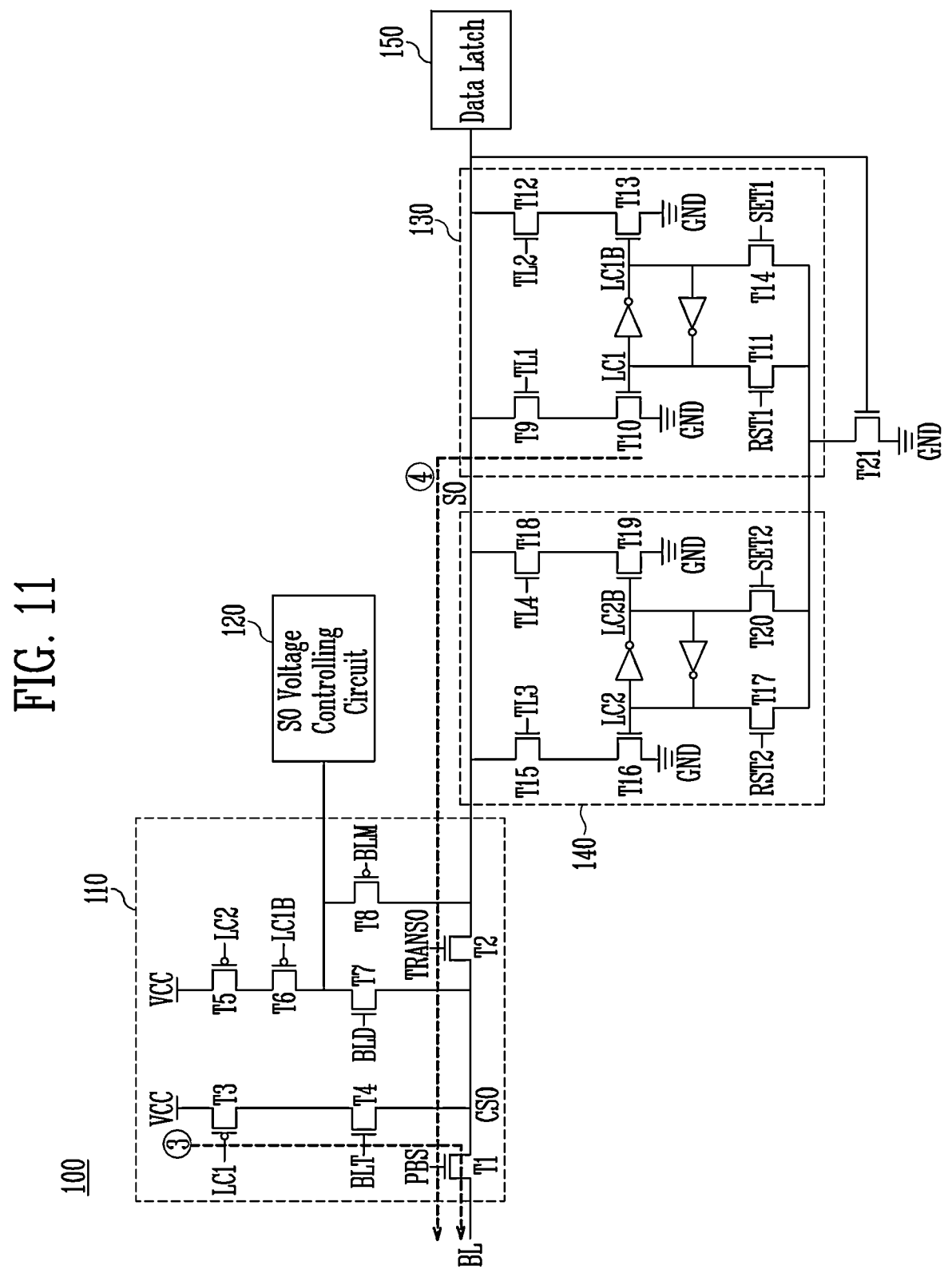
FIG. 11 is a diagram illustrating an example in which the bit line voltage of a memory cell included in any one of a first threshold voltage area and a second threshold voltage area is controlled according to an embodiment of the present disclosure.

FIG. 11 is a diagram illustrating an example in which the bit line voltage of a memory cell included in any one of a first threshold voltage area and a second threshold voltage area is controlled according to an embodiment of the present disclosure.

Referring to FIGS. 6, 10, and 11, when the memory cell is included in the second threshold voltage area AREA2, the first bit value LC1 may correspond to a second logic value and the second bit value LC2 may correspond to a first logic value depending on the fifth latch status information Latch Status5.

During a period from T4 to T5, the bit line voltage controlling circuit 110 may apply the first program-enable voltage corresponding to the first bit line voltage control signal BLT to the bit line BL by turning on the first transistor T1, the third transistor T3, and the fourth transistor T4.

For example, the first transistor T1 may receive a voltage VON in response to a page buffer sensing signal PBS, and may connect the bit line BL to the common sensing node CSO.

When the first bit value LC1 corresponds to the second logic value, the third transistor T3 may transfer the supply voltage VCC to the fourth transistor T4.

The fourth transistor T4 may receive the voltage VREFT in response to the first bit line voltage control signal BLT, and may transfer the voltage VREFT to the common sensing node CSO.

Accordingly, the bit line voltage controlling circuit 110 may apply a voltage VREFT-VTH corresponding to the first program-enable voltage to the bit line BL through path ③.

Also, the fifth transistor T5, the sixth transistor T6, and the eighth transistor T8 may be turned off.

Meanwhile, the second transistor T2 may receive the voltage VON in response to the sensing node sensing signal TRANSO, and may connect the common sensing node CSO to the sensing node SO. The ninth transistor T9 may be turned on in response to the first latch connection signal TL1, and the twelfth transistor T12, the fifteenth transistor T15, and the eighteenth transistor T18 may be turned off in response to the second latch connection signal TL2, the third latch connection signal TL3, and the fourth latch connection signal TL4.

In this case, when the memory cell is included in any one of the first threshold voltage area AREA1, the third threshold voltage area AREA3, and the fourth threshold voltage area AREA4, the ninth transistor T9 may be turned off by receiving a low-level signal depending on fifth latch status information Latch Status5. Accordingly, the ground voltage GND connected to the ninth transistor T9 might not be transferred to the sensing node SO, and the first program-enable voltage may be applied to the bit line BL through path ③. When the memory cell is included in the third threshold voltage area AREA3 or the fourth threshold voltage area AREA4, the second program-enable voltage or the program-inhibit voltage, higher than the first program-enable voltage, is applied to the bit line BL, whereby the bit line BL may be maintained at the second program-enable voltage or the program-inhibit voltage.

Unlike this, when the memory cell is included in the first threshold voltage area AREA1, the ninth transistor T9 may be turned on by receiving a high-level signal. Accordingly, the sensing node SO may receive the ground voltage GND through the ninth transistor T9. Also, the third transistor T3 and the fifth transistor T5 may be turned off, whereby the provision of the supply voltage connected to the third transistor T3 and the fifth transistor T5 may be interrupted. Accordingly, the ground voltage GND may be applied to the bit line BL through path ④.

Figure 12:
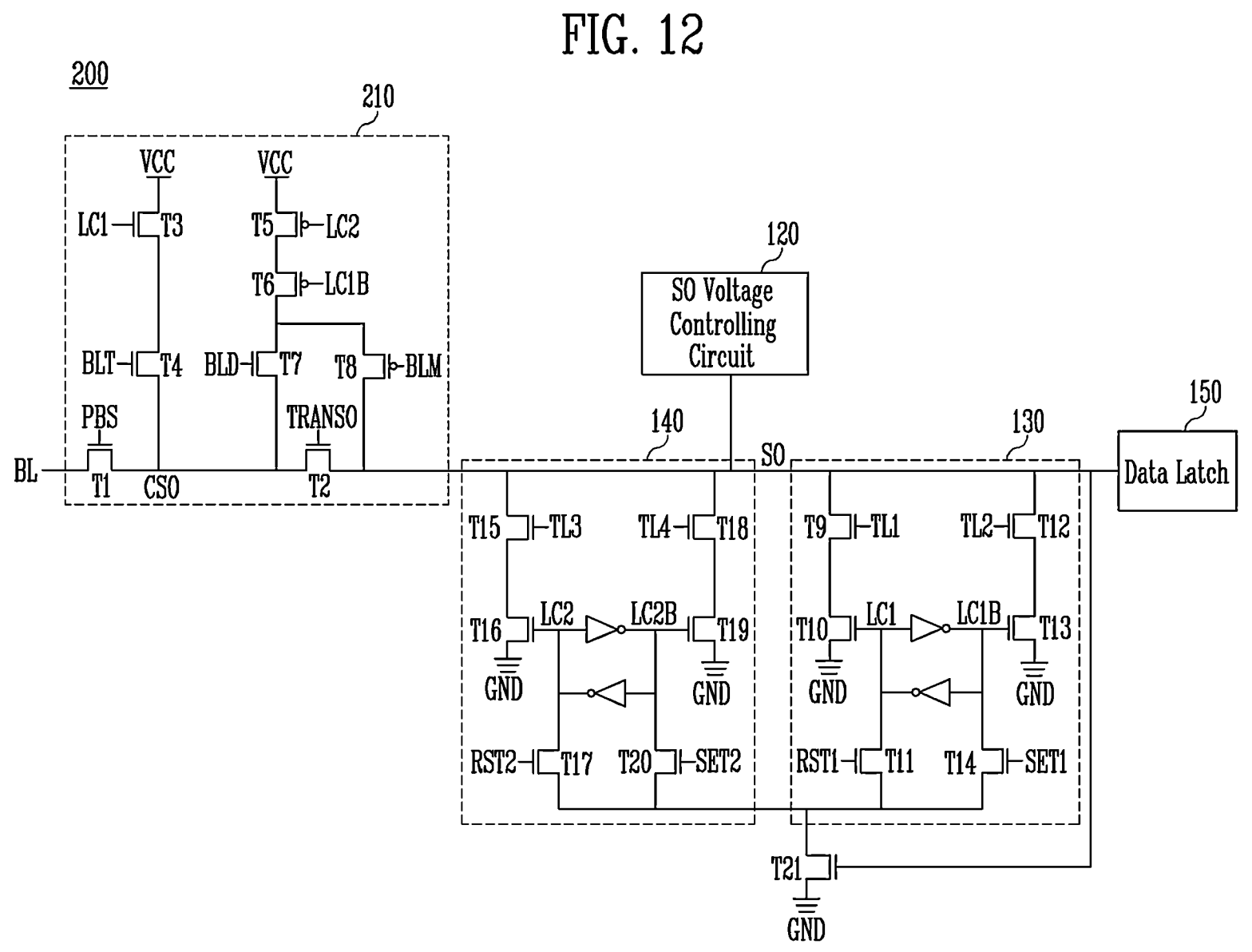

FIG. 12 is a diagram illustrating an example of a page buffer according to an embodiment of the present disclosure.

Referring to FIG. 12, a page buffer 200 may be configured such that a third transistor T3 is implemented as an NMOS transistor, compared to the page buffer 100 of FIG. 1. Accordingly, when a first bit value LC1 corresponds to a first logic value, the third transistor T3 may transfer a supply voltage VCC to a fourth transistor T4.

Meanwhile, in an embodiment, when the third transistor T3 is implemented as an NMOS transistor, the third transistor T3 and the fourth transistor T4 may share a source-drain region without using a separate n-well, and the entire size of the page buffer 200 may be reduced.

Furthermore, in an embodiment, a sensing node voltage controlling circuit 120 may be coupled to a sensing node SO. Accordingly, in an embodiment, the sensing node voltage controlling circuit 120 may provide a precharge voltage to the sensing node SO without passing through an eighth transistor T8.

Descriptions made above with reference to FIGS. 1 to 11 may be equally applied to the remaining components and the operating method thereof, other than the above-described differences.

FIG. 13 is a diagram illustrating a method of performing a triple verify program operation according to an embodiment of the present disclosure. The method illustrated in FIG. 13 may be performed by, for example, the page buffer 100 illustrated in FIG. 1. In an embodiment, the method illustrated in FIG. 13 may be performed by, for example, the page buffer 200 illustrated in FIG. 12.

Referring to FIG. 13, at step S1301, the page buffer 100 may precharge the bit line BL and the sensing node SO.

At step S1303, the page buffer 100 may perform a first evaluation operation based on a first evaluation time.

At step S1305, the page buffer 100 may store a first bit value LC1 determined based on the first evaluation operation in the first latch 130.

At step S1307, the page buffer 100 may perform a second evaluation operation based on a second evaluation time.

At step S1309, the page buffer 100 may store a second bit value LC2 determined based on the second evaluation operation in the second latch 140.

At step S1311, the page buffer 100 may perform a third evaluation operation based on a third evaluation time.

At step S1313, the page buffer 100 may store the first bit value LC1 determined based on the third evaluation operation in the first latch 130.

At step S1315, the page buffer 100 may determine whether a verify operation has passed, based on the first bit value LC1 determined based on the third evaluation operation and the second bit value LC2 determined based on the second evaluation operation.

At step S1317, the page buffer 100 may control voltages that are applied to the bit line BL based on the first bit value LC1 determined based on the third evaluation operation and the second bit value LC2 determined based on the second evaluation operation.

Figure 14:
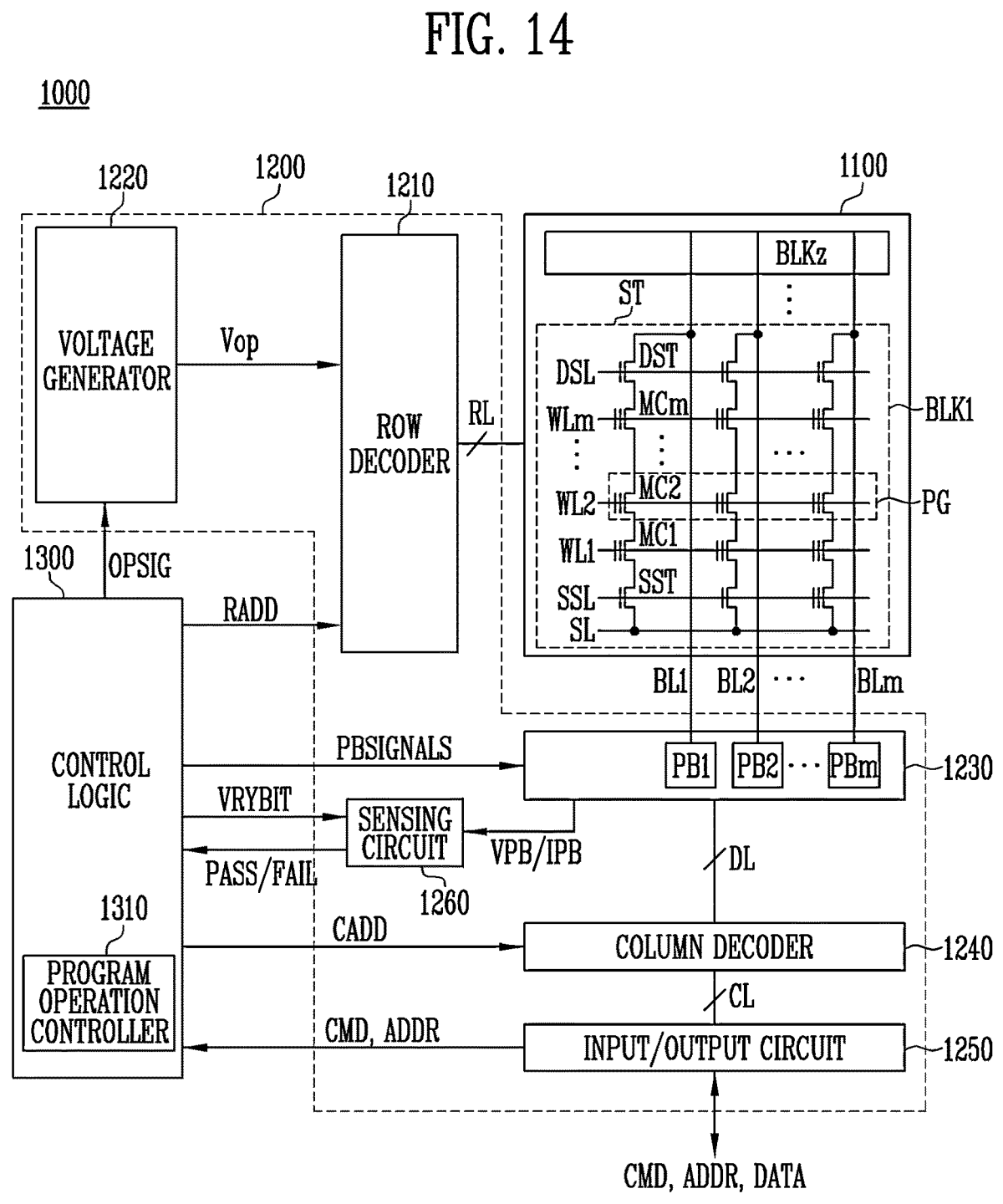

FIG. 14 is a diagram illustrating a memory device according to an embodiment of the present disclosure.

Referring to FIG. 14, a memory device 1000 may include a memory cell array 1100, a peripheral circuit 1200, and control logic 1300. The control logic 1300 may be implemented as hardware, software, or a combination of hardware and software. For example, the control logic 1300 may be a control logic circuit operating in accordance with an algorithm and/or a processor executing control logic code.

The memory cell array 1100 includes a plurality of memory blocks BLK1 to BLKz.

The plurality of memory blocks BLK1 to BLKz are coupled to a row decoder 1210 through row lines RL. Here, the row lines RL may include at least one source select line SSL, a plurality of word lines WL1 to WLm, and at least one drain select line DSL.

Each of the memory blocks BLK1 to BLKz may include a plurality of memory cells MC1 to MCm. The plurality of memory cells MC1 to MCm may be coupled to a page buffer group 1230 through a plurality of bit lines BL1 to BLm. Each of the memory blocks BLK1 to BLKz may include a plurality of memory cell strings ST coupled between the bit lines BL1 to BLm and a source line SL. Each of the memory cell strings ST may include at least one source select transistor SST, a plurality of memory cells MC1 to MCm, and at least one drain select transistor DST which are connected in series to each other between the source line SL and a corresponding one of the bit lines BL1 to BLm.

Memory cells coupled to the same word line may be defined as one page PG. Each of the memory cells MC1 to MCm may store a plurality of data bits.

The peripheral circuit 1200 may perform a program operation, a read operation, or an erase operation on a selected area of the memory cell array 1100 under the control of the control logic 1300.

The peripheral circuit 1200 may include the row decoder 1210, a voltage generator 1220, the page buffer group 1230, a column decoder 1240, an input/output circuit 1250, and a sensing circuit 1260.

The row decoder 1210 may decode a row address RADD received from the control logic 1300. The row decoder 1210 selects at least one of the memory blocks BLK1 to BLKz depending on the decoded address. Further, the row decoder 1210 may select at least one word line of the memory block selected depending on the decoded address. The row decoder 1210 may apply voltages Vop generated by the voltage generator 1220 to the selected word line.

The voltage generator 1220 may generate a plurality of voltages using an external supply voltage provided to the memory device 1000. For example, the voltage generator 1220 may generate various operating voltages Vop that are used for program, read, and erase operations in response to an operation signal OPSIG. The plurality of generated voltages Vop may be supplied to the memory cell array 1100 by the row decoder 1210.

The page buffer group 1230 may include a plurality of page buffers PB1 to PBm. Each of the page buffers 100 and 200 illustrated in FIGS. 1 and 12 may correspond to any one of the plurality of page buffers PB1 to PBm. The plurality of page buffers PB1 to PBm may store data received through the plurality of bit lines BL1 to BLm or sense the voltages or currents of the plurality of bit lines BL1 to BLm during a read or verify operation in response to page buffer control signals PBSIGNALS.

Each of the plurality of page buffers PB1 to PBm may include a first latch which stores a first bit value among a plurality of bit values indicating the threshold voltage area of a selected memory cell, and a second latch which stores a second bit value among the plurality of bit values.

The column decoder 1240 may transfer data between the input/output circuit 1250 and the page buffer group 1230 in response to a column address CADD.

The input/output circuit 1250 may transmit a command CMD and an address ADDR, received from a memory controller (not illustrated), to the control logic 1300, or may exchange data DATA with the column decoder 1240.

The sensing circuit 1260 may determine whether a verify operation for a specific program state has passed with the application of a verify voltage.

In an example, during the verify operation, the sensing circuit 1260 may generate a reference current in response to an enable bit signal VRYBIT, and may compare a sensing voltage VPB received from the page buffer group 1230 with a reference voltage generated by the reference current and then output a pass signal PASS or a fail signal FAIL. In an example, during the verify operation, the sensing circuit 1260 may generate a reference voltage in response to the enable bit signal VRYBIT, and may compare a sensing current IPB received from the page buffer group 1230 with a reference current generated by the reference voltage and then output a pass signal PASS or a fail signal FAIL.

The control logic 1300 may control the peripheral circuit 1200 by outputting the operation signal OPSIG, the row address RADD, and the page buffer control signals PBSIG-NALS in response to the command CMD and the address ADDR.

In an embodiment, the control logic 1300 may include a program operation controller 1310.

The program operation controller 1310 may control a program operation of the memory device 1000. For example, the program operation controller 1310 may provide the operation signal OPSIG for controlling the generation of a program voltage and a verify voltage to the voltage generator 1220, and may generate a row address RADD by decoding the address ADDR of a word line in which data DATA is to be stored.

In an embodiment, the program operation controller 1310 may determine whether the verify operation has passed depending on whether the first bit value and the second bit value, stored in each of the plurality of page buffers PB1 to PBm, correspond to a first logic value or a second logic value.

In an embodiment, the program operation controller 1310 may control voltages that are applied to the plurality of bit lines BL1 to BLm during a program voltage apply operation depending on whether the first bit value and the second bit value, stored in each of the plurality of page buffers PB1 to PBm, correspond to a first logic value or a second logic value.

According to an embodiment of the present disclosure, there are provided a page buffer, a memory device including the page buffer, and a method of operating the page buffer, which can improve the threshold voltage distribution of memory cells and reduce a circuit size.

What is claimed is:

1. A page buffer connected to a memory cell through a bit line, the page buffer comprising:

a sensing node connected to the bit line;

a bit line voltage controlling circuit configured to precharge the bit line during a verify operation;

a sensing node voltage controlling circuit configured to precharge the sensing node while the bit line is precharged;

a first latch connected to the sensing node, and configured to store a first bit value that is determined based on a first evaluation operation among a plurality of bit values corresponding to a voltage level of the sensing node after the sensing node is precharged; and a second latch connected to the sensing node, and configured to store a second bit value determined based on a second evaluation operation among the plurality of bit values after the first bit value is stored in the first latch, wherein the first latch stores the first bit value that is determined based on a third evaluation operation after the second bit value is stored in the second latch.

2. The page buffer according to claim 1, wherein the verify operation is performed based on a triple verify program method including a first verify operation based on the first evaluation operation, a second verify operation based on the second evaluation operation, and a third verify operation based on the third evaluation operation.

3. The page buffer according to claim 1, wherein:

the first evaluation operation is performed based on a first evaluation time, the second evaluation operation is performed based on a second evaluation time longer than the first evaluation time, and the third evaluation operation is performed based on a third evaluation time longer than the second evaluation time.

4. The page buffer according to claim 3, wherein the sensing node voltage controlling circuit is configured to re-precharge the sensing node after the first bit value is stored and the second bit value is stored.

5. The page buffer according to claim 4, wherein:

the first evaluation operation is performed during the first evaluation time from a time point at which precharging of the sensing node is completed, the second evaluation operation is performed during the second evaluation time from a time point at which re-precharging of the sensing node is completed after the first bit value is stored, and the third evaluation operation is performed during the third evaluation time from a time point at which re-precharging of the sensing node is completed after the second bit value is stored.

6. The page buffer according to claim 3, wherein:

the first evaluation operation is performed during the first evaluation time from a time point at which precharging of the sensing node is completed, the second evaluation operation is performed during the second evaluation time from a time point at which precharging of the sensing node is completed, and the third evaluation operation is performed during the third evaluation time from a time point at which precharging of the sensing node is completed.

7. The page buffer according to claim 1, wherein the first latch is configured to:

store the first bit value determined based on the first evaluation operation in response to a first latch control signal for controlling the first latch after the first evaluation operation is completed, and store the first bit value determined based on the third evaluation operation in response to a second latch control signal for controlling the first latch after the third evaluation operation is completed.

8. The page buffer according to claim 1, wherein the second latch is configured to store the second bit value determined based on the second evaluation operation in response to a third latch control signal for controlling the second latch after the second evaluation operation is completed.

9. The page buffer according to claim 1, wherein the first latch and the second latch are configured to store a first logic value that is an initial logic value before the first evaluation operation is performed.

10. The page buffer according to claim 9, wherein the bit line voltage controlling circuit is configured to, during a program voltage apply operation performed after the verify operation, apply any one of a ground voltage, a first program-enable voltage higher than the ground voltage, a second program-enable voltage higher than the first program-enable voltage, and a program-inhibit voltage higher than the second program-enable voltage to the bit line, depending on whether each of the first bit value determined based on the third evaluation operation and the second bit value determined based on the second evaluation operation corresponds to any one of the first logic value and a second logic value that is an inverted value of the first logic value.

11. The page buffer according to claim 10, wherein the bit line voltage controlling circuit is configured to, when the first bit value determined based on the third evaluation operation and the second bit value determined based on the second evaluation operation correspond to the first logic value, apply the ground voltage to the bit line.

12. The page buffer according to claim 10, wherein the bit line voltage controlling circuit is configured to, when the first bit value determined based on the third evaluation operation corresponds to the second logic value and the second bit value determined based on the second evaluation operation corresponds to the first logic value, apply the first program-enable voltage to the bit line.

13. The page buffer according to claim 10, wherein the bit line voltage controlling circuit is configured to, when the first bit value determined based on the third evaluation operation and the second bit value determined based on the second evaluation operation correspond to the second logic value, apply the second program-enable voltage to the bit line.

14. The page buffer according to claim 10, wherein the bit line voltage controlling circuit is configured to, when the first bit value determined based on the third evaluation operation corresponds to the first logic value and the second bit value determined based on the second evaluation operation corresponds to the second logic value, apply the program-inhibit voltage to the bit line.

15. The page buffer according to claim 14, further comprising:

a data latch configured to store data indicating whether the verify operation has passed.

16. A method of operating a page buffer connected to a memory cell through a bit line, the method comprising:

precharging the bit line and a sensing node;

performing a first evaluation operation on the sensing node based on a first evaluation time;

storing a first bit value, determined based on the first evaluation operation, in a first latch;

performing a second evaluation operation based on a second evaluation time longer than the first evaluation time;

storing a second bit value determined based on the second evaluation operation in a second latch;

performing a third evaluation operation based on a third evaluation time longer than the second evaluation time;

storing the first bit value, determined based on the third evaluation operation, in the first latch;

determining whether a verify operation has passed, based on the first bit value determined based on the third evaluation operation and the second bit value determined based on the second evaluation operation; and control a voltage that is applied to the bit line, based on the first bit value determined based on the third evaluation operation and the second bit value determined based on the second evaluation operation.

* * * * *